(12) United States Patent
Jiang et al.

(10) Patent No.: US 8,729,927 B2
(45) Date of Patent: May 20, 2014

(54) CASCODE DRIVE CIRCUITRY

(71) Applicant: STMicroelectronics R&D (Shanghai) Co. Ltd., Shanghai (CN)

(72) Inventors: Ming Jiang, Shanghai (CN); Jerry Cui, Shanghai (CN)

(73) Assignee: STMicroelectronics R&D (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 13/657,930

(22) Filed: Oct. 23, 2012

(65) Prior Publication Data

US 2013/0169344 A1 Jul. 4, 2013

(30) Foreign Application Priority Data

Dec. 31, 2011 (CN) .......................... 2011 1 0461915

(51) Int. Cl.
*H03K 3/00* (2006.01)
(52) U.S. Cl.
USPC .......................................... 327/108; 327/112
(58) Field of Classification Search
USPC ................................................. 327/108–112
See application file for complete search history.

(56) References Cited

U.S. PATENT DOCUMENTS

| | | | | |
|---|---|---|---|---|
| 5,973,534 A * | 10/1999 | Singh | ........................... | 327/309 |
| 6,653,884 B2 * | 11/2003 | Fujii et al. | ..................... | 327/319 |
| 6,693,469 B2 * | 2/2004 | Prodanov | ...................... | 327/108 |
| 7,675,320 B2 * | 3/2010 | Speers et al. | .................... | 326/39 |
| 8,154,323 B2 * | 4/2012 | Kim et al. | ..................... | 327/108 |

\* cited by examiner

*Primary Examiner* — Kenneth B. Wells
(74) *Attorney, Agent, or Firm* — Gardere Wynne Sewell LLP

(57) ABSTRACT

A drive circuit includes a switching transistor having a design maximum voltage V2 and a cascode transistor having a design maximum voltage V1, wherein the cascode transistor is source-drain coupled in series with the switching transistor. The circuit further includes a current source coupled between an intermediate voltage node and a gate of the cascode transistor. If the drive circuit is a low side driver, the intermediate voltage node receives an intermediate voltage Vmed set below a high supply voltage Vhigh and that meets the following conditions: a) Vmed<=V2 and b) Vhigh−Vmed<=V1. If the drive circuit is a high side driver, the intermediate voltage node receives an intermediate voltage Vmed set below the high supply voltage and that mees the following conditions: a) Vmed<=V1 and b) Vhigh−Vmed<=V2. The circuit may be configured as a push pull driver by coupling a high side driver and low side driver in series.

17 Claims, 2 Drawing Sheets

US 8,729,927 B2

CASCODE DRIVE CIRCUITRY

PRIORITY CLAIM

This application claims priority from Chinese Application for Patent No. 201110461915.9 filed Dec. 31, 2011, the disclosure of which is hereby incorporated by reference.

TECHNICAL FIELD

The present invention relates to output drive circuits of the low-side, high side and push-pull type, and more particularly to an output drive circuit incorporating at least one cascode transistor.

BACKGROUND

Cost is one, and sometimes a dominating, factor considered when designing silicon devices for consumer and automotive electronics. There are well known constraints imposed on the circuit designer by process technology and/or masks in order to accomplish cost reduction. These constraints often necessitate the use of lower voltage components in situations where it is known or anticipated that the circuit will be exposed to higher voltage conditions. For example, it is not uncommon for a given process technology and/or masks to produce components having a certain design maximum voltage (for example, 45V). Cost considerations may require the use of such process technology and/or masks, and thus corresponding devices having a relatively lower maximum voltage, when designing and producing a circuit for a higher voltage (for example, 60V) application. When designing a circuit using components whose maximum voltage is less than the circuit application voltage, special care must be taken to ensure that no individual device will be operated in the higher voltage application with a voltage that exceeds the lower maximum voltage rating. For example, the designer may utilize a number of protective zener diodes to protect the Vds and Vgs of included MOSFET devices. This solution adds to the complexity of the circuit design, and the additional protective components undesirably increase circuit die size.

There is a need in the art for a circuit design technique to address the complexity and die size problems noted above, while permitting the circuit designer to use components whose maximum voltage rating is less than the circuit voltage.

It is known in the art to provide cascode devices in high voltage circuits. The gate of the cascode device is connected to a fixed reference voltage. A problem with this configuration is that the cascode device, with a gate connected to the supply rail, will preclude operation of the circuit support a swing in the voltage at the output node to the supply rail voltage when the switching transistor is activated.

There is a need in the art for a circuit design technique to address the foregoing problem.

SUMMARY

In an embodiment, a drive circuit comprises: an output node configured to be coupled to a load circuit supplied from a first reference voltage node that is configured to receive a first reference voltage; a first transistor having a source-drain path coupled between the output node and an intermediate node; a second transistor having a source-drain path coupled between the intermediate node and a second reference voltage node that is configured to receive a second reference voltage; and a current source coupled between a gate of the first transistor and a third reference voltage node that is configured to receive a third reference voltage. The second transistor has a gate configured to receive a switching control signal.

In an embodiment, the first transistor has a design maximum voltage V1, and the second transistor has a design maximum voltage V2. The third reference voltage is less than or equal to V2 and a difference between the first reference voltage and the third reference voltage is less than or equal to V1.

In another embodiment, the first transistor has a design maximum voltage V1, and the second transistor has a design maximum voltage V2. The third reference voltage is less than or equal to V1 and a difference between the first reference voltage and the third reference voltage is less than or equal to V2.

In an embodiment, a drive circuit comprises: an output node; a first transistor having a source-drain path coupled between the output node and a first intermediate node; a second transistor having a source-drain path coupled between the first intermediate node and a first reference voltage node that is configured to receive a first reference voltage; a third transistor having a source-drain path coupled between the output node and a second intermediate node; a fourth transistor having a source-drain path coupled between the second node and a second reference voltage node that is configured to receive a second reference voltage; a first current source coupled between a gate of the first transistor and a third reference voltage node that is configured to receive a third reference voltage; and a second current source coupled between a gate of the third transistor and the third reference voltage node. The second and fourth transistors have gates configured to receive a differential switching control signal.

In an embodiment, the second and third transistors each have a design maximum voltage V1, and the first and fourth transistors each have a design maximum voltage V2. The third reference voltage is less than or equal to V2 and a difference between the first reference voltage and the third reference voltage is less than or equal to V1.

In an embodiment, a drive circuit comprises: a switching transistor having a design maximum voltage V2; a cascode transistor having a design maximum voltage V1, the cascode transistor source-drain coupled in series with the switching transistor; and a current source coupled between an intermediate voltage node and a gate of the cascode transistor. The intermediate voltage node is configured to receive an intermediate voltage Vmed set between a higher supply voltage Vhigh and a lower supply voltage for the drive circuit; said intermediate voltage Vmed meeting the following conditions: a) Vmed<=V2 and b) Vhigh−Vmed<=V1.

In another embodiment, a drive circuit comprises: a switching transistor having a design maximum voltage V2; a cascode transistor having a design maximum voltage V1, the cascode transistor source-drain coupled in series with the switching transistor; and a current source coupled between an intermediate voltage node and a gate of the cascode transistor. The intermediate voltage node is configured to receive an intermediate voltage Vmed set between a higher supply voltage Vhigh and a lower supply voltage for the drive circuit; said intermediate voltage Vmed meeting the following conditions: a) Vmed<=V1 and b) Vhigh−Vmed<=V2.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
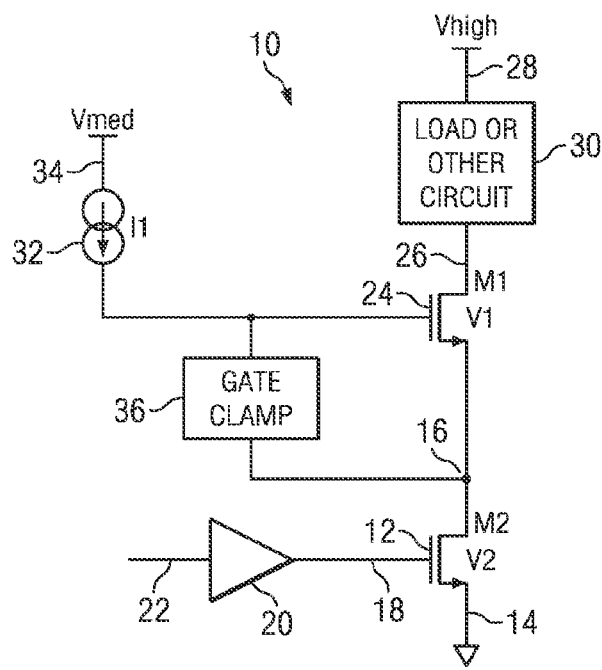
FIG. 1 is a schematic diagram of a low-side drive circuit.
Figure 4:
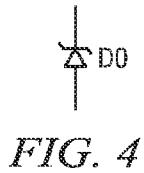
FIG. 4 is a schematic diagram of a gate clamp circuit.
Figure 5:
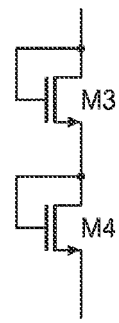
FIG. 5 is a schematic diagram of a gate clamp circuit.

Reference is now made to FIG. 1 which shows a schematic diagram of a low-side drive circuit 10. The low side drive circuit 10 includes a switching transistor (M2) 12 (of the n-channel type). The source terminal of the transistor 12 is coupled to a first reference voltage node 14 (in this case, node 14 is associated with a lower reference voltage such as ground). The drain terminal of the transistor 12 is coupled to an intermediate node 16. The gate terminal of the transistor 12 is coupled to receive a gate drive (switching) signal generated at the output 18 of a driving circuit 20. The driving circuit 20 is typically formed from a drive amplifier (of any suitable configuration known in the art for driving a switching transistor) that receives a switching control signal at input node 22. The low side drive circuit 10 further includes a cascode transistor (M1) 24 (also of the n-channel type). The source terminal of the transistor 24 is coupled to the intermediate node 16. Thus, the source-drain path of transistor 12 is coupled in series with the source-drain path of transistor 24. The drain terminal of the transistor 24 is coupled to an output node 26. Coupled between the output node 26 and a second reference voltage node 28 (in this case, node 28 is associated with a higher reference voltage Vhigh which may be externally applied to the chip or generated on the chip from a lower voltage, for example through use of a charge pump regulator) is a load (or other) circuit 30 that is driven by the low side drive circuit 10. Thus, the source-drain paths of transistor 12 and transistor 24 are coupled in series with the load (or other) circuit 30. The gate terminal of the transistor 24 is coupled to receive a bias signal generated by a current source (I1) 32. The current source 32 is coupled between the gate terminal of the transistor 24 and an intermediate voltage node 34 (where node 34 is associated with an intermediate voltage Vmed having a value that is between the lower reference voltage and the higher reference voltage). The current source 32 may be provided by a properly biased (for example through a current mirror) p-channel transistor whose source is connected to the intermediate voltage node 34 and whose drain is connected to the gate terminal of the transistor 24. The low side drive circuit 10 further includes a gate clamp circuit 36 coupled between the gate terminal of the transistor 24 and the intermediate node 16. The gate clamp circuit 36 may, for example, comprise a zener diode (as shown in FIG. 4) or a plurality of diode connected n-channel transistors (as shown in FIG. 5).

The given process technology and/or masks used to produce the transistor 12 and 24 components will result in the production of devices which have a certain design maximum voltage. The transistor 12 has a design maximum voltage V2, and the transistor 24 has a design maximum voltage V1. The sum of the voltage V2 (for transistor 12) and the voltage V1 (for transistor 24) must exceed the higher reference voltage (Vhigh), but neither V1 nor V2 alone exceeds Vhigh. As discussed above, the intermediate voltage at the intermediate voltage node 34 has a value that is between the lower reference voltage and the higher reference voltage. This intermediate voltage Vmed (which may be an externally or internally generated supply voltage with respect to the integrated circuit chip) is selected to meet both of the following conditions: a) Vmed<=V2; and b) Vhigh−Vmed<=V1. Additionally, the current source (I1) 32 is designed as a relatively weak bias whose output current is less than the sinking (conduction) current capability of the switching transistor 12.

In operation, first take the situation where switching transistor 12 is turned on by the amplifier circuit 20. In this mode, it is assumed that the drain voltage of the cascode transistor 24 will approach the lower reference voltage (such as ground). The current source 32 will then source its current into the gate of transistor 24 and the clamping circuit 36. The gate-to-source voltage at the gate of transistor 24 is limited by the clamping circuit 36 to the clamp voltage. There is no over-voltage condition of concern with respect to transistors 12 and 24. Additionally, the current provided by the current source 32 permits the voltage at the gate of cascode transistor 24 to safely swing down and permit a rail-to-rail swing in the output voltage at the output node 26.

Next, consider the situation where switching transistor 12 is turned off by the amplifier circuit 20. The voltage at the source terminal of transistor 24 (i.e., at the intermediate node 16) is determined by various leakage currents of the transistors 12 and 24, the gate clamp circuit 36 and the current generator 32. The voltage at the intermediate node will be close to the intermediate voltage Vmed, and it will be recognized at this operating point that neither transistor 12 nor transistor 24 will be exposed to a voltage in excess of their design maximum voltages of V2 and V1, respectively. Specifically, the voltage across the source-drain of transistor 12 will be about Vmed which is less than the design maximum voltage of V2, and the voltage across the source-drain of transistor 24 will be about Vhigh−Vmed which is less than the design maximum voltage of V1.

Figure 2:
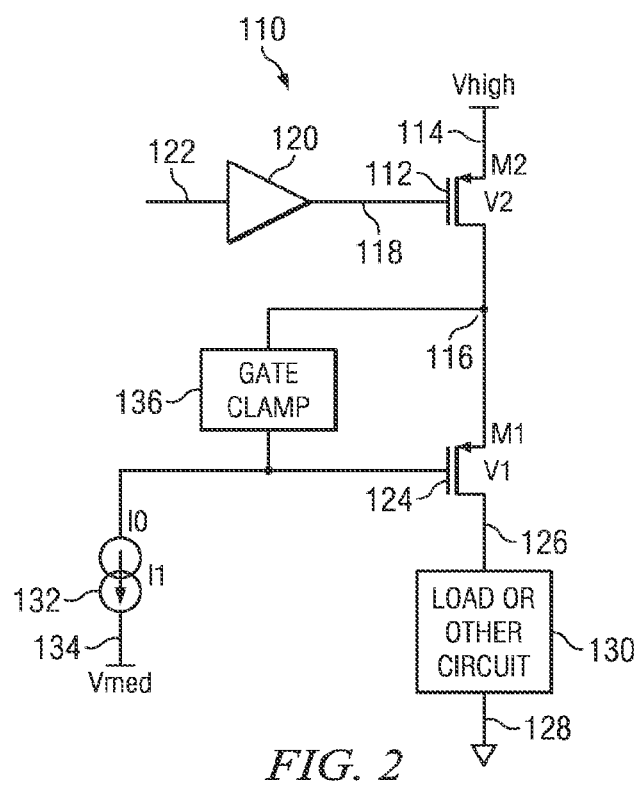
FIG. 2 is a schematic diagram of a high-side drive circuit.
Figure 6:
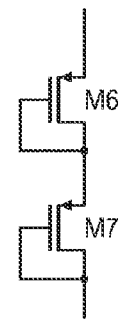
FIG. 6 is a schematic diagram of a gate clamp circuit.

Reference is now made to FIG. 2 which shows a schematic diagram of a high-side drive circuit 110. The high side drive circuit 110 includes a switching transistor (M2) 112 (of the p-channel type). The source terminal of the transistor 112 is coupled to a first reference voltage node 114 (in this case, node 114 is associated with a higher reference voltage Vhigh which may be externally applied to the chip or generated on the chip from a lower voltage, for example through use of a charge pump regulator). The drain terminal of the transistor 112 is coupled to an intermediate node 116. The gate terminal of the transistor 112 is coupled to receive a gate drive signal generated at the output 118 of a driving circuit 120. The driving circuit 120 is typically formed from a drive amplifier that receives a switching control signal at input node 122. The high side drive circuit 110 further includes a cascode transistor (M1) 124 (also of the p-channel type). The source terminal of the transistor 124 is coupled to the intermediate node 116. Thus, the source-drain path of transistor 112 is coupled in series with the source-drain path of transistor 124. The drain terminal of the transistor 124 is coupled to an output node 126. Coupled between the output node 126 and a second reference voltage node 128 (in this case, node 128 is associated with a lower reference voltage such as ground) is load (or other) circuitry 130 that is driven by the high side drive circuit 110. Thus, the source-drain paths of transistor 112 and transistor 124 are coupled in series with the load (or other) circuitry 130. The gate terminal of the transistor 124 is coupled to a bias signal generated by a current source (I1) 132. The current source 132 is coupled between the gate terminal of the transistor 124 and an intermediate voltage node 134 (where node 134 is associated with an intermediate voltage Vmed having a value that is between the lower reference voltage and the higher reference voltage). The current source 132 may be provided by a properly biased (for example through a current mirror) n-channel transistor whose source is connected to the intermediate voltage node 134 and whose drain is connected to the gate terminal of the transistor 124. The high side drive circuit 110 further includes a gate clamp circuit 136 coupled between the gate terminal of the transistor 124 and the intermediate node 116. The gate clamp circuit 136 may, for example, comprise a zener diode (as shown in FIG. 4) or a plurality of diode connected p-channel transistors (as shown in FIG. 6).

The given process technology and/or masks used to produce the transistor 112 and 124 components will result in the production of devices which have a certain design maximum voltage. The transistor 112 has a design maximum voltage V2, and the transistor 124 has a design maximum voltage V1. The sum of the voltage V2 (for transistor 112) and the voltage V1 (for transistor 124) must exceed the higher reference voltage (Vhigh), but neither V1 nor V2 alone exceeds Vhigh. As discussed above, the intermediate voltage at the intermediate voltage node 134 has a value that is between the lower reference voltage and the higher reference voltage. This intermediate voltage Vmed (which may be an externally or internally generated supply voltage) is selected to meet both of the following conditions: a) Vmed<=V1; and b) Vhigh–Vmed<=V2. Additionally, the current source (I1) 132 is designed as a relatively weak bias whose output current is less than the sourcing (conduction) current capability of the switching transistor 112.

In operation, first take the situation where switching transistor 112 is turned on by the amplifier circuit 120. In this mode, it is assumed that the drain voltage of the cascode transistor 124 will approach the higher reference voltage. The current source 132 will then sink its current from the gate of transistor 124 and the clamping circuit 136. The gate-to-source voltage at the gate of transistor 124 is limited by the clamping circuit 136 to the clamp voltage. There is no overvoltage condition of concern with respect to transistors 112 and 124. Additionally, the current provided by the current source 132 permits the voltage at the gate of cascode transistor 124 to safely swing up and permit a rail-to-rail swing in the output voltage at the output node 126.

Next, consider the situation where switching transistor 112 is turned off by the amplifier circuit 120. The voltage at the source terminal of transistor 124 (i.e., at the intermediate node 116) is determined by various leakage currents of the transistors 112 and 124, the gate clamp circuit 136 and the current generator 132. The voltage at the intermediate node will be close to the intermediate voltage Vmed, and it will be recognized that neither transistor 112 nor transistor 124 will be exposed to a voltage in excess of their design maximum voltages of V2 and V1, respectively. Specifically, the voltage across the source-drain of transistor 112 will be about Vhigh–Vmed which is less than the design maximum voltage of V2, and the voltage across the source-drain of transistor 124 will be about Vmed which is less than the design maximum voltage of V1.

Figure 3:
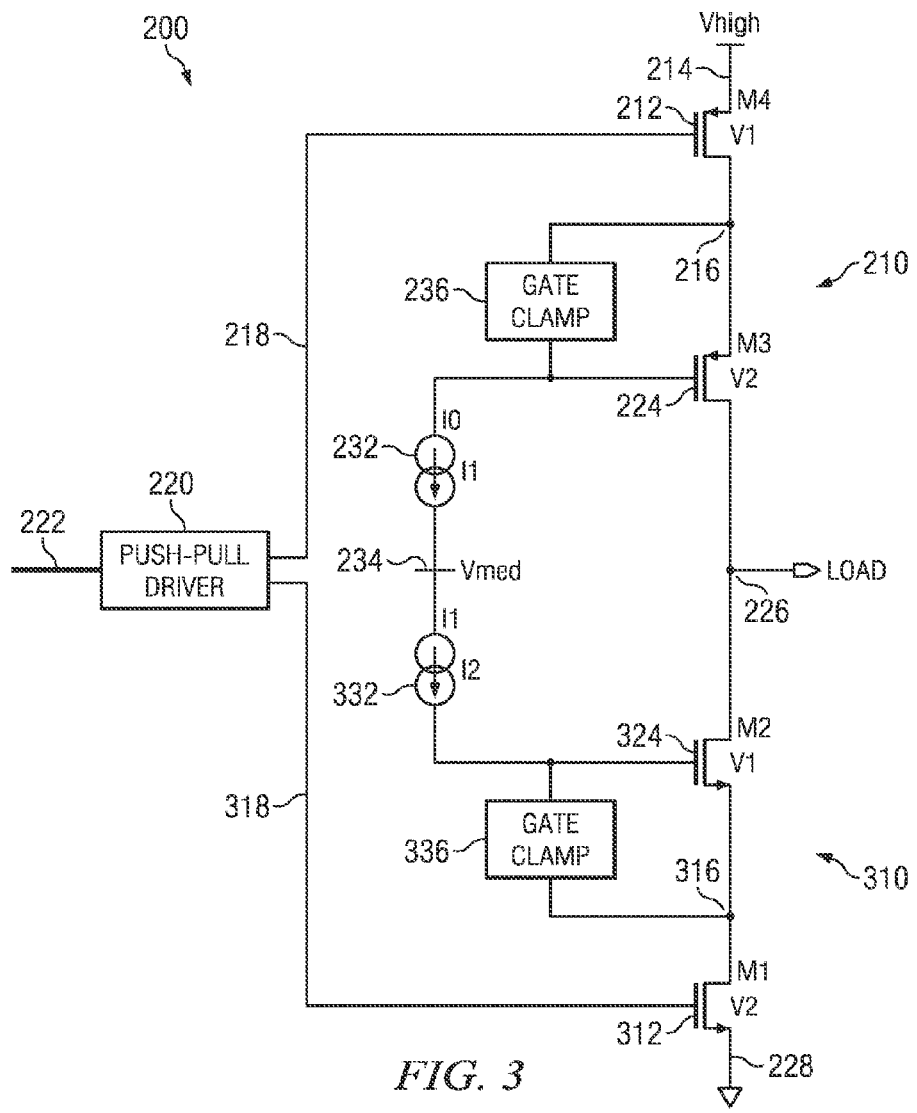
FIG. 3 is a schematic diagram of a push-pull drive circuit.

Reference is now made to FIG. 3 which shows a schematic diagram of a push-pull drive circuit 200. The push-pull drive circuit 200 includes a high side drive circuit 210 which includes a switching transistor (M4) 212 (of the p-channel type). The source terminal of the transistor 212 is coupled to a first reference voltage node 214 (in this case, node 214 is associated with a higher reference voltage Vhigh which may be externally applied to the chip or generated on the chip from a lower voltage, for example through use of a charge pump regulator). The drain terminal of the transistor 212 is coupled to a first intermediate node 216. The gate terminal of the transistor 212 is coupled to receive a gate drive signal generated at the positive output 218 of a differential driving circuit 220. The driving circuit 220 is typically formed from a differential drive amplifier that receives a switching control signal at input node 222. The high side drive circuit 210 further includes a cascode transistor (M3) 224 (also of the p-channel type). The source terminal of the transistor 224 is coupled to the intermediate node 216. Thus, the source-drain path of transistor 212 is coupled in series with the source-drain path of transistor 224. The drain terminal of the transistor 224 is coupled to an output node 226. The gate terminal of the transistor 224 is coupled to a bias signal generated by a first current source (I1) 232. The current source 232 is coupled between the gate terminal of the transistor 224 and an intermediate voltage node 234 (where node 234 is associated with an intermediate voltage Vmed having a value that is between the higher reference voltage and a lower reference voltage (such as ground) presented at a second reference voltage node 228. The current source 232 may be provided by a properly biased (for example through a current mirror) n-channel transistor whose source is connected to the intermediate voltage node 234 and whose drain is connected to the gate terminal of the transistor 224. The high side drive circuit 210 further includes a gate clamp circuit 236 coupled between the gate terminal of the transistor 224 and the intermediate node 216. The gate clamp circuit 236 may, for example, comprise a zener diode (as shown in FIG. 4) or a plurality of diode connected p-channel transistors (as shown in FIG. 6).

The push-pull drive circuit 200 further includes a low side drive circuit 310 includes a switching transistor (M1) 312 (of the n-channel type). The source terminal of the transistor 312 is coupled to the second reference voltage node 228 (in this case, node 228 is associated with a lower reference voltage such as ground). The drain terminal of the transistor 312 is coupled to a second intermediate node 316. The gate terminal of the transistor 312 is coupled to receive a gate drive signal generated at the negative output 318 of the differential driving circuit 220. The low side drive circuit 310 further includes a cascode transistor (M2) 324 (also of the n-channel type). The source terminal of the transistor 324 is coupled to the intermediate node 316. Thus, the source-drain path of transistor 312 is coupled in series with the source-drain path of transistor 324. The drain terminal of the transistor 324 is coupled to the output node 226. The gate terminal of the transistor 324 is coupled to receive a bias signal generated by a second current source (I2) 332. The current source 332 is coupled between the gate terminal of the transistor 324 and the intermediate voltage node 234. The current source 332 may be provided by a properly biased (for example through a current mirror) p-channel transistor whose source is connected to the intermediate voltage node 234 and whose drain is connected to the gate terminal of the transistor 324. The low side drive circuit 310 further includes a gate clamp circuit 336 coupled between the gate terminal of the transistor 324 and the intermediate node 316. The gate clamp circuit 336 may, for example, comprise a zener diode (as shown in FIG. 4) or a plurality of diode connected n-channel transistors (as shown in FIG. 5).

The given process technology and/or masks used to produce the transistor 212, 224, 312 and 324 components will result in the production of devices which have a certain design maximum voltage. The transistor 212 has a design maximum voltage V1, the transistor 224 has a design maximum voltage V2, the transistor 312 has a design maximum voltage V2, and the transistor 324 has a design maximum voltage V1. The sum of the voltage V2 (for transistors 224 and 312) and the voltage V1 (for transistors 212 and 324) must exceed the higher reference voltage (Vhigh), but neither V1 nor V2 alone exceeds Vhigh. As discussed above, the intermediate voltage at the intermediate voltage node 234 has a value that is between the lower reference voltage and the higher reference voltage. This intermediate voltage Vmed (which may be an externally or internally generated supply voltage) is selected to meet both of the following conditions: a) Vmed<=V2; and b) Vhigh−Vmed<=V1. Additionally, the current sources 232 and 332 are designed as a relatively weak biases whose output currents are less than the conduction current capabilities of their respective switching transistors 212 and 312.

The implementations proposed herein provide an additional advantage of prior art configurations in terms of fabrication with respect to mask saving. For example, the proposed circuits may require one or two fewer masks (depending on process technology used). A recognized drawback of the proposed circuits concerns a slight increase in die area for circuit implementation due to the presence of the current generator circuitry coupled to the cascode gate and the inclusion of gate protection circuitry. However, this added die area is in most cases negligible, and the drawback is offset by mask saving and shortened wafer cycle time.

The foregoing description has provided by way of exemplary and non-limiting examples a full and informative description of the exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A drive circuit, comprising:
an output node configured to be coupled to a load circuit supplied from a first reference voltage node that is configured to receive a first reference voltage;
a first transistor having a source-drain path coupled between the output node and an intermediate node;
a second transistor having a source-drain path coupled between the intermediate node and a second reference voltage node that is configured to receive a second reference voltage, wherein the second transistor has a gate configured to receive a switching control signal;
a current source coupled between a gate of the first transistor and a third reference voltage node that is configured to receive a third reference voltage; and
a clamping circuit coupled between the gate and a source of the first transistor, said clamping circuit configured to clamp the gate-to-source voltage of the first transistor when the second transistor is turned on by said switching control signal.

2. The circuit of claim 1,
wherein the first transistor has a design maximum voltage V1;
wherein the second transistor has a design maximum voltage V2; and
wherein the third reference voltage is less than or equal to V2 and a difference between the first reference voltage and the third reference voltage is less than or equal to V1.

3. The circuit of claim 2, wherein the first and second transistors are n-channel transistors, and the first reference voltage is higher than the second reference voltage.

4. The circuit of claim 1, wherein the clamping circuit is further configured to clamp the gate-to-source voltage of the first transistor when both the first transistor and second transistor are conducting current, said clamping circuit permitting the gate-to-source voltage to swing to a level between the third reference voltage and the second reference voltage.

5. The circuit of claim 1, wherein the current source has an output current value less than a conduction current value for the second transistor.

6. The circuit of claim 1,
wherein the first transistor has a design maximum voltage V1;
wherein the second transistor has a design maximum voltage V2; and
wherein the third reference voltage is less than or equal to V1 and a difference between the first reference voltage and the third reference voltage is less than or equal to V2.

7. The circuit of claim 6, wherein the first and second transistors are p-channel transistors, and the second reference voltage is higher than the first reference voltage.

8. A drive circuit, comprising:
an output node;
a first transistor having a source-drain path coupled between the output node and a first intermediate node;
a second transistor having a source-drain path coupled between the first intermediate node and a first reference voltage node that is configured to receive a first reference voltage;
a third transistor having a source-drain path coupled between the output node and a second intermediate node;
a fourth transistor having a source-drain path coupled between the second intermediate node and a second reference voltage node that is configured to receive a second reference voltage;
a first current source coupled between a gate of the first transistor and a third reference voltage node that is configured to receive a third reference voltage;
a second current source coupled between a gate of the third transistor and the third reference voltage node;
wherein the second and fourth transistors have gates configured to receive a differential switching control signal;
a first clamping circuit coupled between the gate and a source of the first transistor, said first clamping circuit configured to clamp the gate-to-source voltage of the first transistor when the second transistor is turned on; and
a second clamping circuit coupled between the gate and a source of the third transistor, said second clamping circuit configured to clamp the gate-to-source voltage of the third transistor when the fourth transistor is turned on.

9. The circuit of claim 8,
wherein the second and third transistors each have a design maximum voltage V1;
wherein the first and fourth transistors each have a design maximum voltage V2; and
wherein the third reference voltage is less than or equal to V2 and a difference between the first reference voltage and the third reference voltage is less than or equal to V1.

10. The circuit of claim 8, wherein the first reference voltage is higher than the second reference voltage.

11. The circuit of claim 8, wherein the first and second transistors are p-channel transistors, and the third and fourth transistors are n-channel transistors.

12. The circuit of claim 8, wherein the first clamping circuit is configured to clamp the gate-to-source voltage of the first transistor when both the first transistor and second transistor are conducting current, said first clamping circuit permitting the gate-to-source voltage to swing to a level between the third reference voltage and the first reference voltage and wherein the second clamping circuit is configured to clamp the gate-to-source voltage of the third transistor when both the third transistor and fourth transistor are conducting current, said second clamping circuit permitting the gate-tosource voltage to swing to a level between the third reference voltage and the second reference voltage.

13. The circuit of claim 8, wherein the first current source has an output current value less than a conduction current value for the second transistor, and the second current source has an output current value less than a conduction current value for the fourth transistor.

14. A drive circuit, comprising:
an output node configured to be coupled to a load circuit supplied from a first reference voltage node that is configured to receive a first reference voltage;
a first transistor having a source-drain path coupled between the output node and an intermediate node;
a second transistor having a source-drain path coupled between the intermediate node and a second reference voltage node that is configured to receive a second reference voltage;
a current source coupled between a gate of the first transistor and a third reference voltage node that is configured to receive a third reference voltage, said current source configured to supply a variable gate voltage to the gate of the first transistor; and
a clamp circuit configured to control a maximum swing of the variable gate voltage at the first transistor to a level between the third reference voltage and second reference voltage in response to turn on of the second transistor.

15. The circuit of claim 14, wherein the second transistor has a gate configured to receive a switching control signal.

16. A drive circuit, comprising:
an output node;
a first transistor having a source-drain path coupled between the output node and a first intermediate node;
a second transistor having a source-drain path coupled between the first intermediate node and a first reference voltage node that is configured to receive a first reference voltage;
a first current source coupled between a gate of the first transistor and a third reference voltage node that is configured to receive a second reference voltage, the first current source configured to supply a variable gate voltage to the gate of the first transistor;
a first clamp circuit configured to control a maximum swing of the variable gate voltage at the first transistor to a level between the second reference voltage and first reference voltage in response to turn on of the second transistor;
a third transistor having a source-drain path coupled between the output node and a second intermediate node;
a fourth transistor having a source-drain path coupled between the second intermediate node and a second reference voltage node that is configured to receive a third reference voltage;
a second current source coupled between a gate of the third transistor and the second reference voltage node, the second current source configured to supply a variable gate voltage to the gate of the third transistor; and
a second clamp circuit configured to control a maximum swing of the variable gate voltage at the third transistor to a level between the second reference voltage and third reference voltage in response to turn on of the fourth transistor.

17. The circuit of claim 16, wherein the second and fourth transistors have gates configured to receive a differential switching control signal.

* * * * *